(12) United States Patent
Tayrani

(10) Patent No.: US 7,053,484 B2
(45) Date of Patent: May 30, 2006

(54) MINIATURE BROADBAND SWITCHED FILTER BANK

(75) Inventor: Reza Tayrani, Marina Del Rey, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/822,409

(22) Filed: Apr. 12, 2004

(65) Prior Publication Data
US 2005/0224845 A1    Oct. 13, 2005

(51) Int. Cl.
*H01L 23/34* (2006.01)

(52) U.S. Cl. .................... 257/728; 257/723

(58) Field of Classification Search ............ 257/723, 257/728

See application file for complete search history.

(56) References Cited

U.S. PATENT DOCUMENTS

| 3,959,749 A | 5/1976 | Ikushima |
| 6,414,570 B1 | 7/2002 | Dalconzo |
| 2004/0036558 A1 | 2/2004 | Allison |

*Primary Examiner*—Long Pham
(74) *Attorney, Agent, or Firm*—Leonard A. Alkov; Karl A. Vick

(57) ABSTRACT

A miniaturized microwave circuit. The novel circuit includes a first substrate, a first ground plate disposed on a bottom surface of the first substrate, a second substrate attached to a top surface of the first substrate and adapted to cover a portion of the first substrate, a second ground plate disposed on a top surface of the second substrate, a pattern of metallization disposed between the first and second substrates to form a stripline circuit, one or more ground paths disposed on the top surface of the first substrate and including a plurality of vias connected to the first ground plate, and one or more openings cut into the second substrate and second ground plate, wherein each opening follows and is aligned over a portion of a ground path and is filled in with conducting material, such that the second ground plate is connected to the first ground plate.

12 Claims, 7 Drawing Sheets

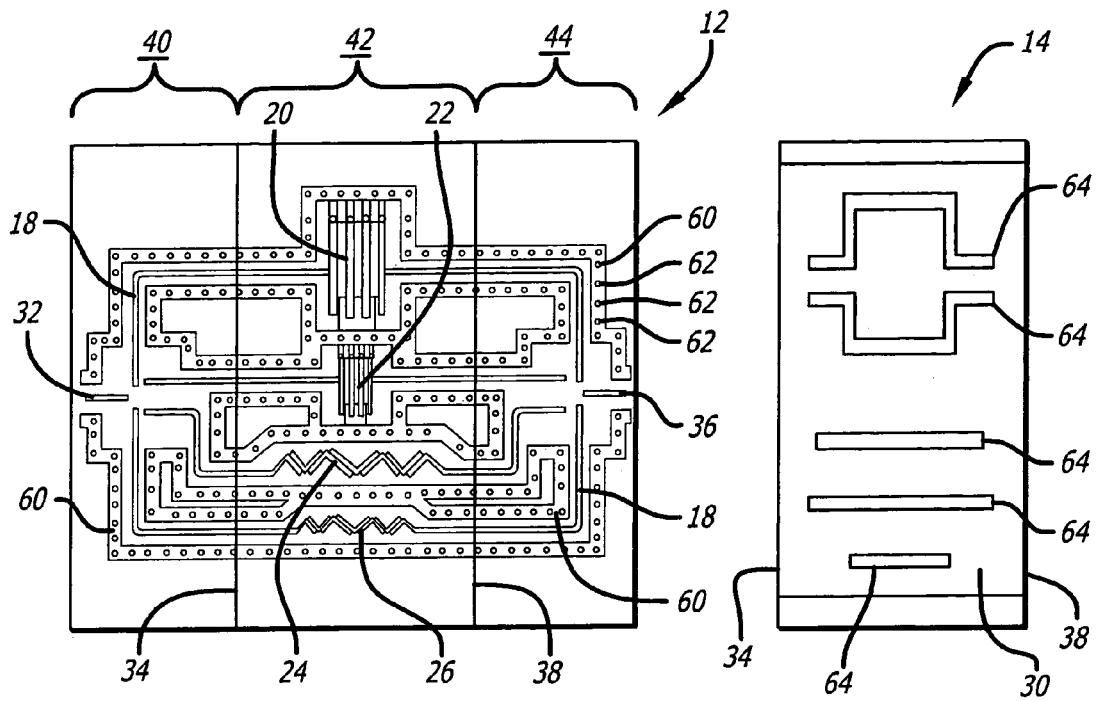
FIG. 2B
FIG. 2C
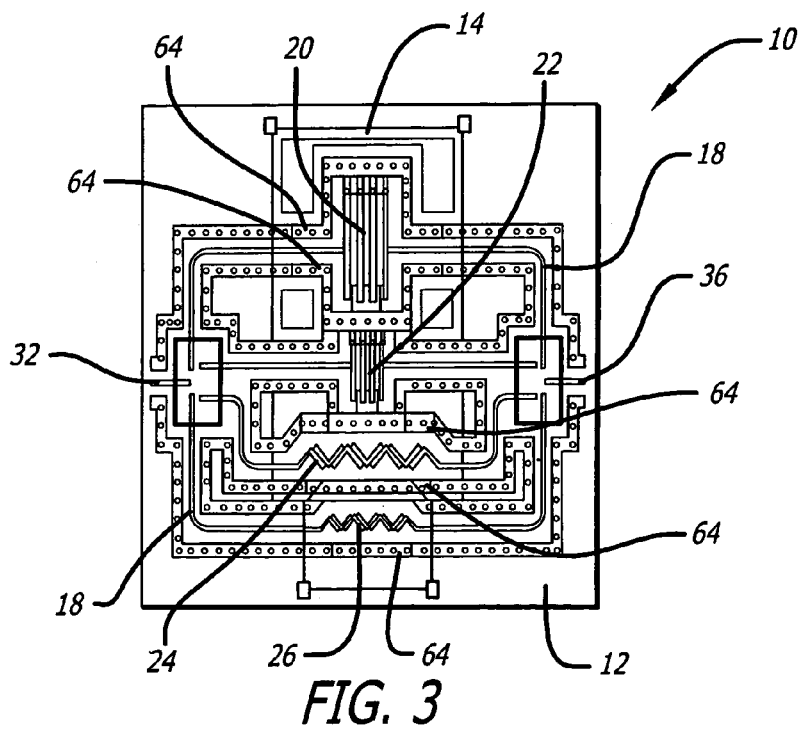
FIG. 3

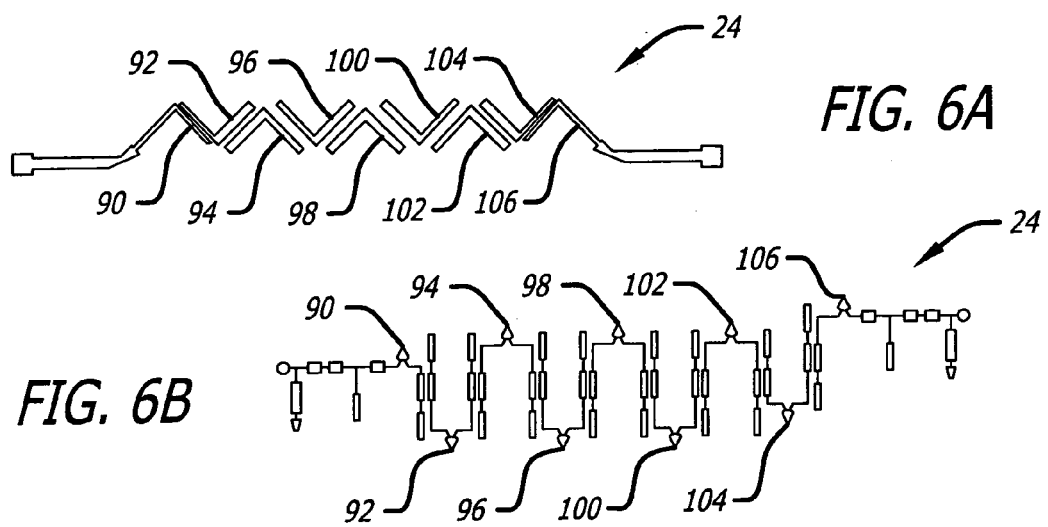
FIG. 6A
FIG. 6B
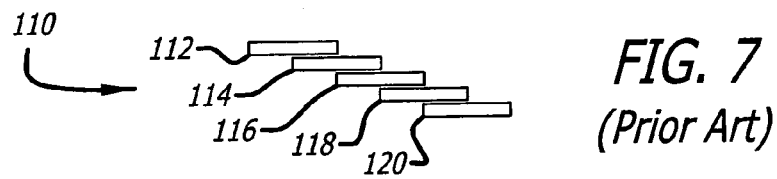
FIG. 7 (Prior Art)
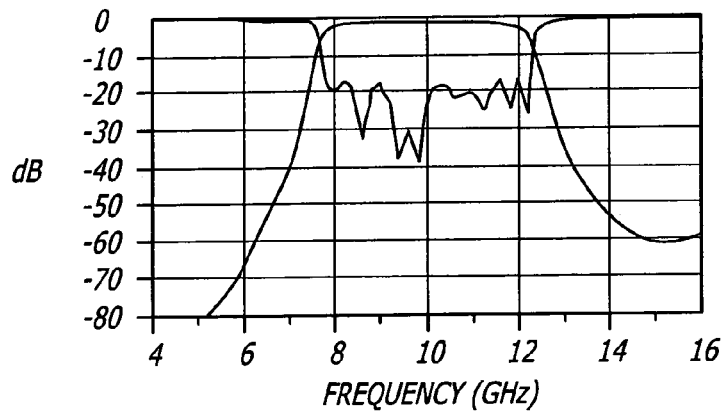
FIG. 8A
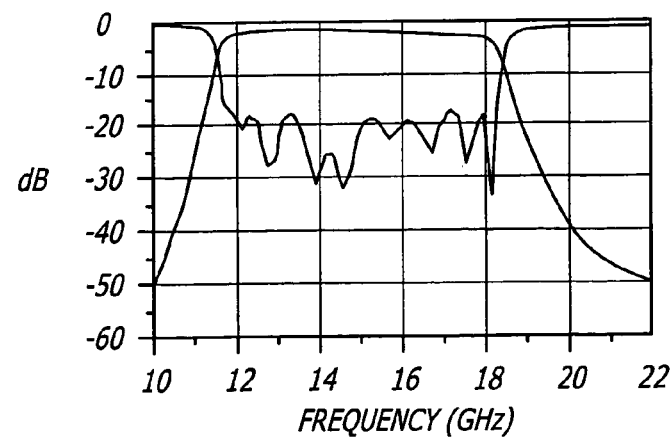
FIG. 8B

US 7,053,484 B2

MINIATURE BROADBAND SWITCHED FILTER BANK

BACKGROUND OF THE INVENTION

1. Field of the Invention

The present invention relates to microwave circuits. More specifically, the present invention relates to multiband microwave filter banks utilizing microelectromechanical switches.

2. Description of the Related Art

Multiband microwave filters are used in a variety of applications, such as communications, electronic warfare (EW), and instrumentation devices, to separate and identify signals in different frequency bands. Design requirements for these filters often include low cost, small size, light weight, low power dissipation, and high performance.

For certain applications, two of the most critical specifications are cost and size. A microwave filter bank is typically implemented in a miniature microwave multi-chip module (MCM). Presently, all microwave multi-layer technologies, i.e., Duroid, LTCC (low temperature co-fired ceramic), Alumina, etc., are in their infancies, requiring tight process controls to meet the demands of high performance buried circuits such as bandpass filters. Such a tight control on material and processing increases the unit production cost to be prohibitively high. The most common technology for filter miniaturization uses lanthanum aluminate ($LaAlO_3$) substrates. These types of material are used exclusively in conjunction with low temperature superconducting (HTS) films. Such substrates are expensive, suffer from a high dislocation density, and have a relatively low dielectric constant, which results in a large, heavy circuit.

A common design for a multiband microwave filter connects a set of bandpass filters between two single pole multiple throw switches. These switches are typically implemented with semiconductor elements such as transistors or PIN diodes. At microwave frequencies, however, these devices suffer from several shortcomings. PIN diodes and transistors typically have an insertion loss (the loss across the switch when the switch is closed) greater than 1 dB, and an isolation value of less than 20 dB. This low level of isolation allows a signal to "bleed" across the switch even when the switch is open. In addition, PIN diodes and transistors have a limited frequency response and consume around 100–300 mW of DC power. These switches therefore increase the insertion loss and power dissipation of the overall multiband filter.

Hence, there is a need in the art for an improved multiband microwave filter bank that offers lower cost, smaller size, lighter weight, and improved performance over prior art filters.

SUMMARY OF THE INVENTION

The need in the art is addressed by the miniaturized microwave circuit of the present invention. In general, the novel circuit includes a first substrate, a first ground plate disposed on a bottom surface of the first substrate, a second substrate attached to a top surface of the first substrate and adapted to cover a portion of the first substrate, a second ground plate disposed on a top surface of the second substrate, a pattern of metallization disposed between the first and second substrates to form a stripline circuit, one or more ground paths disposed on the top surface of the first substrate and including a plurality of vias connected to the first ground plate, and one or more openings cut into the second substrate and second ground plate, wherein each opening follows and is aligned over a portion of a ground path and is filled in with conducting material, such that the second ground plate is connected to the first ground plate. In an illustrative embodiment, the novel circuit is adapted for use as a switched filter bank. A novel single pole multiple throw switch comprised of a plurality of microelectromechanical switching components is also described for use in the switched filter bank.

BRIEF DESCRIPTION OF THE DRAWINGS

FIG. 2b is a diagram showing a top view of the bottom substrate of the illustrative switched filter bank.

FIG. 2c is a diagram showing a top view of the top substrate of the illustrative switched filter bank.

FIG. 3 is a diagram of the layout of the illustrative switched filter bank, showing the location of the top substrate over the bottom substrate.

FIG. 6a is a diagram of an illustrative layout of a zig-zag filter designed in accordance with the teachings of the present invention.

FIG. 6b is an equivalent circuit schematic of an illustrative zig-zag filter designed in accordance with the teachings of the present invention.

FIG. 7 is a diagram of an illustrative layout of a conventional edge coupled filter.

FIG. 8a is graph showing the frequency response of the third filter for the illustrative filter bank.

FIG. 8b is graph showing the frequency response of the fourth filter for the illustrative filter bank.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
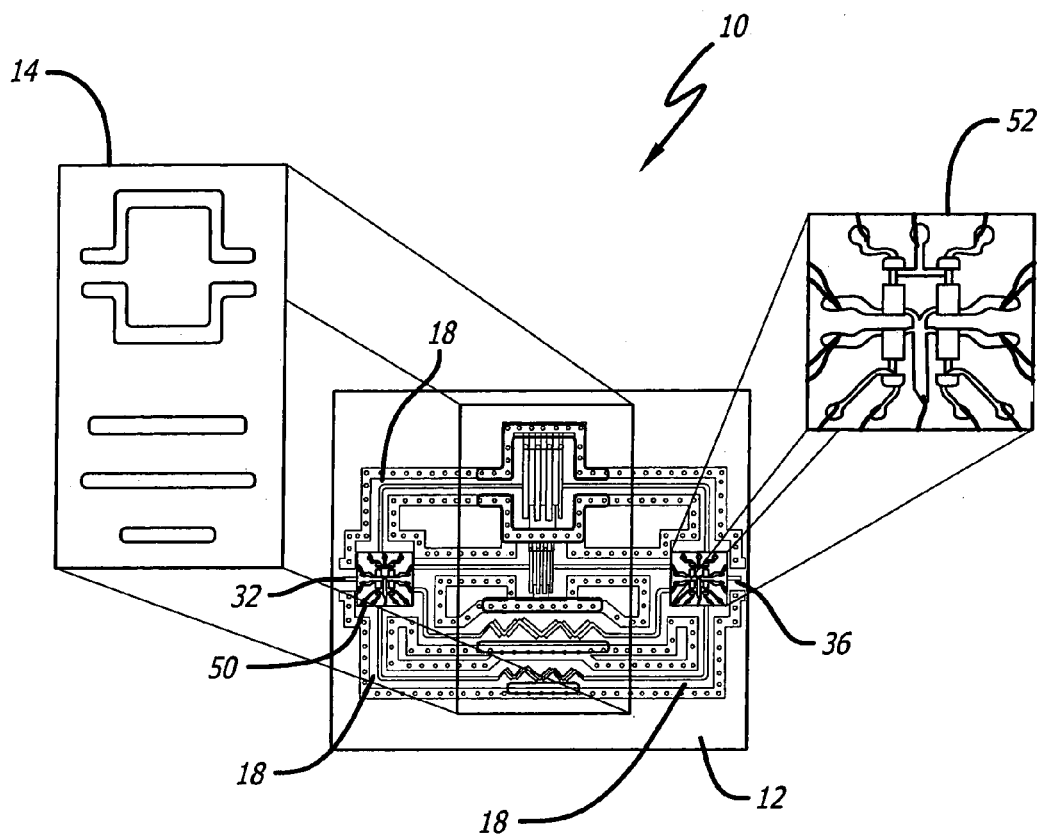
FIG. 1 is a diagram showing an exploded view of an illustrative embodiment of a switched filter bank designed in accordance with the teachings of the present invention.

FIG. 1 is an exploded view of an illustrative embodiment of a switched filter bank 10 designed in accordance with the teachings of the present invention. The circuit 10 is comprised of two substrates, a bottom substrate 12 and a top substrate 14, each substrate having a top surface and a bottom surface. In accordance with the teachings of the present invention, the two substrates are composed of high dielectric constant ceramic having a relative dielectric constant of Er=40–100. In one embodiment, both substrates are fabricated from a zirconium-titanate compound, having a relative dielectric constant of Er=40.

Figure 2A:
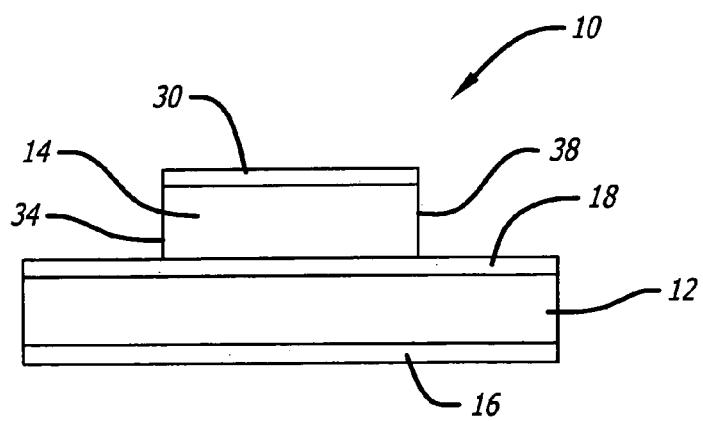
FIG. 2a is a diagram showing a side view of the illustrative switched filter bank, illustrating the multiple layers of the circuit.

FIG. 2a is a diagram showing a side view of the illustrative switched filter bank 10, illustrating the multiple layers of the circuit 10. Note that in FIG. 2b, the thicknesses of the multiple layers of the circuit 10 are exaggerated for clarity. As shown in FIG. 2a, a layer of metallization, or ground plate 16, is disposed on the bottom surface of the bottom substrate 12 to form a first ground plane. A pattern of metallization is etched on the top surface of the bottom substrate 12 to form transmission lines 18 and, for the illustrative switched filter bank embodiment, a plurality of transmission line filters.

FIG. 2b is a diagram showing a top view of the bottom substrate 12, illustrating the transmission lines 18 and filters etched on the top surface of the substrate 12. In the illustrative embodiment shown, the circuit 10 includes four bandpass filters 20, 22, 24, and 26. The invention, however, is not limited thereto. The circuit 10 may include any number or type of filters, or other types of microwave circuits, without departing from the scope of the present teachings. The circuit 10 also includes an input port 32 and an output port 36. A plurality of transmission lines 18 couple energy from the input port 32 to the filters, and from the filters to the output port 36.

FIG. 2c is a diagram showing a top view of the top substrate 14. In this embodiment, the horizontal width of the top substrate 14, between a left edge 34 and a right edge 38, is smaller than that of the bottom substrate 12. The top substrate 14 is attached on top of the bottom substrate 12, such that it covers the portion of the bottom substrate 12 containing the filters 20, 22, 24, and 26. A layer of metallization is disposed on the top surface of the top substrate 14 to form a second ground plane 30 (shown in FIG. 2a). The filters are thus implemented in stripline.

As shown in FIG. 2b, the four filters 20, 22, 24, and 26 are arranged in parallel in the center region 42 of the bottom substrate 12. The top substrate 14 is therefore attached to cover the center region 42 of the bottom substrate 12. The region 40 between the input port 32 and the left edge 34 of the top substrate 14 is not covered by the top substrate 14, and transmission lines 18 in this region are thus implemented in microstrip. Similarly, the region 44 between the output port 36 and the right edge 38 of the top substrate 14 is not covered by the top substrate 14, and transmission lines 18 in this region are therefore implemented in microstrip.

Thus, in the illustrative embodiment, the microwave circuit 10 is comprised of three regions (as shown in FIG. 2b): an input section 40, a processing section 42, and an output section 44. The processing section 42, which includes the four filters 20, 22, 24, and 26, is implemented in stripline through the addition of the second substrate 14 on top of the bottom substrate 12. The input section 40, between the input port 32 and the processing section 42, is implemented in microstrip, and includes microstrip transmission lines 18 for transmitting a signal from the input port 32 to the processing section 42, i.e. to each of the four filters 20, 22, 24, and 26. The output section 44, between the processing section 42 and the output port 36, is also implemented in microstrip, and includes microstrip transmission lines 18 for transmitting signals output from the processing section 42 (from the four filters 20, 22, 24, and 26) to the output port 36. Broadband transmission line transitions embedded in the connecting transmission lines 18 are used to account for the changes in the propagation medium.

In addition, one or more MIC (microwave integrated circuit) chips may be attached to the top surface of the bottom substrate 12 in the input 40 and/or output 44 sections. In the illustrative embodiment, the filter bank 10 includes two switch chips (shown in FIG. 1): a first single pole four throw (SP4T) switch chip 50 attached in the input section 40 adapted to couple the input port 32 to a selected filter, and a second SP4T switch chip 52 in the output section 44 adapted to coupled the output from the selected filter to the output port 36. The input section 40 therefore includes four transmission lines 18, each transmission line 18 adapted to couple one of the four outputs of the SP4T chip 50 to one of the four filters 20, 22, 24, and 26. The output section 44 also includes four transmission lines 18, each transmission line 18 adapted to couple the output of one of the four filters 20, 22, 24, and 26 to one of the four inputs of the SP4T chip 52.

The transmission lines 18 are isolated from interacting with each other by confining each between two finite ground paths 60 (shown in FIG. 2b). The ground paths 60 contain several vertical vias 62 which connect the ground paths 60 to the main ground 16 located on the bottom of the bottom substrate 12. As is well known in the art, vias are vertical holes that are drilled through the substrate 12 and filled with metal, thereby connecting to the main ground 16. The ground paths 60 are also adapted to isolate the four filters 20, 22, 24 and 26.

As shown in FIG. 2c, the top substrate 14 has five openings 64 that are produced by drilling through both the substrate 14 and the top ground plate 30 by using laser drilling or any other suitable method. The openings 64 form windows that follow portions of the ground paths 60 on the bottom substrate 12, and are used to provide a seamless RF ground path between the top 30 and bottom 16 ground plates by utilizing a metallization method called wrap-around-ground.

FIG. 3 is a diagram of the layout of the illustrative switched filter bank 10, showing the location of the top substrate 14 in position over the bottom substrate 12. When the top substrate 14 is attached to the bottom substrate 12, the openings 64 are aligned over their respective ground paths 60. The openings 64 are then filled in with liquid metal to connect the top ground plate 30 to the ground paths 60 on the bottom substrate 12, which are connected to the bottom ground plate 16.

The illustrative filter bank 10 of the present invention includes four buried bandpass filters in the stripline processing section 42: a first filter 20 covering the 2–4 GHz frequency band, a second filter 22 covering 4–8 GHz, a third filter 24 covering 8–12 GHz, and a fourth filter 26 covering 12–18 GHz. In the illustrative embodiment, the first filter 20 and second filter 22 are implemented as interdigital structures, and the third filter 24 and fourth filter 26 are implemented using a novel "zig-zag" structure.

Figure 4:
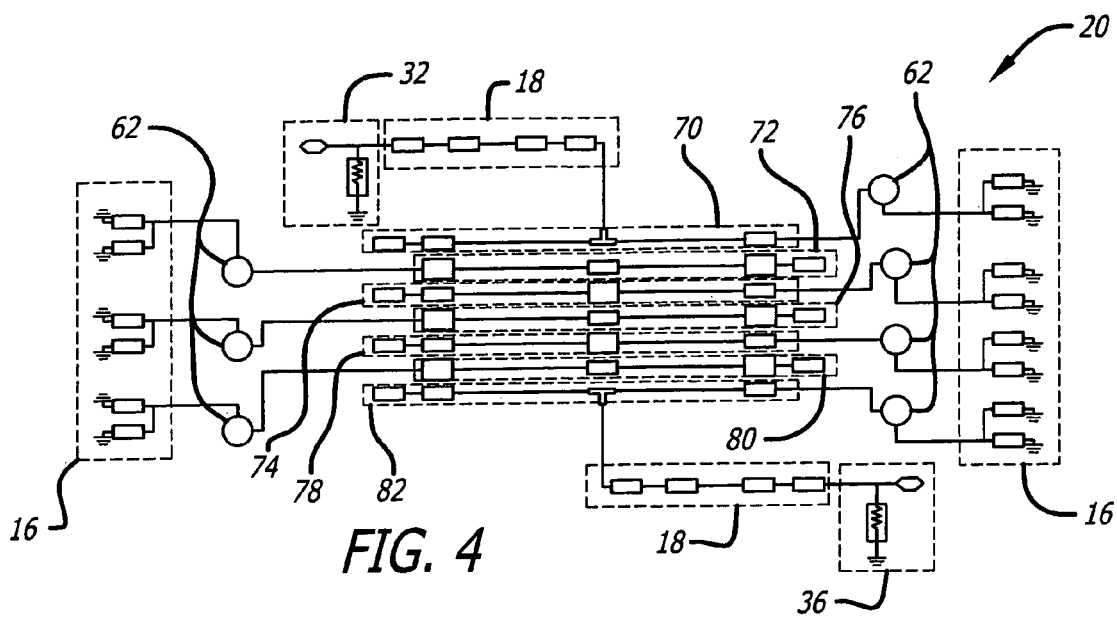
FIG. 4 is an equivalent circuit schematic of an interdigital filter, which can be used in the illustrative filter bank.

FIG. 4 is an equivalent circuit schematic of an interdigital filter 20, which can be used in the illustrative filter bank 10. As is well known in the art, an interdigital filter 20 includes a plurality of rods or resonators disposed in parallel (seven resonators 70, 72, 74, 76, 78, 80, and 82 are shown in the illustrative embodiment of FIG. 4). Each resonator is short-circuited at one end (connected to the bottom ground plate 16 by the vias 62) and open-circuited at the other end, with adjacent resonators—for example, resonators 70 and 72—having opposite ends open-circuited. Also shown in FIG. 4 are equivalent circuit diagrams for the input port 32, which is coupled to the first filter resonator 70 by a transmission line 18, and the output port 36, which is coupled to the last filter resonator 82 by a transmission line 18. The width, length, and spacing of the resonators determine the frequency response of the filter 20. In the illustrative filter bank 10 shown in FIGS. 1–3, the first filter 20 and second filter 22 are implemented using this type of design.

Figure 5A:
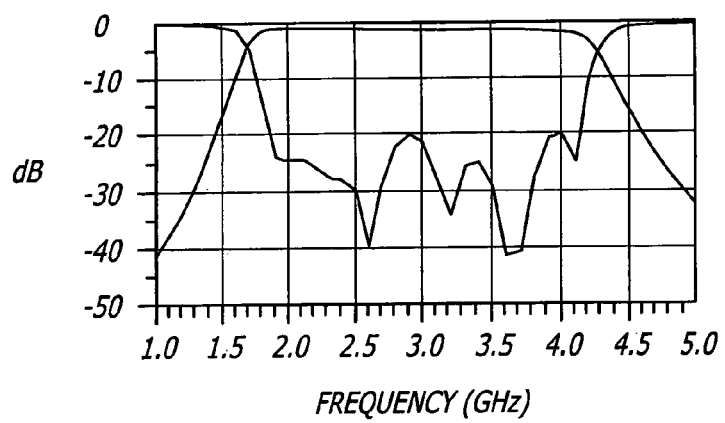
FIG. 5a is graph showing the frequency response of the first filter for the illustrative filter bank.
Figure 5B:
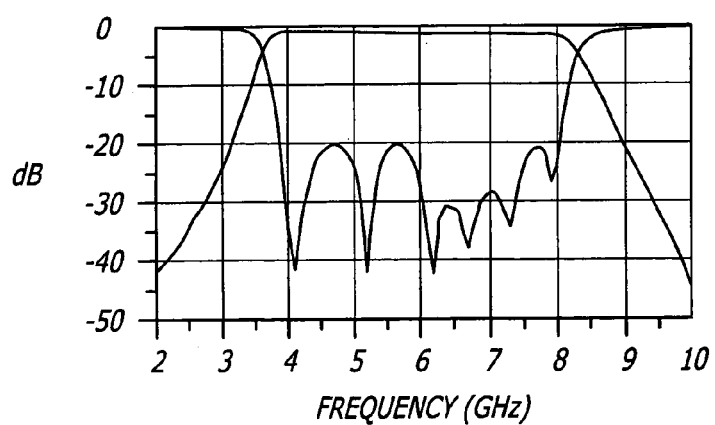
FIG. 5b is graph showing the frequency response of the second filter for the illustrative filter bank.

FIG. 5a is graph showing the frequency response of the first filter 20 for the illustrative filter bank 10, and FIG. 5b is graph showing the frequency response of the second filter 22. As shown in FIGS. 5a and 5b, the first filter 20 is a bandpass filter covering 2–4 GHz and the second filter 22 is a bandpass filter covering 4–8 GHz.

In the illustrative filter bank 10 shown in FIGS. 1–3, the third filter 24 and fourth filter 26 are implemented using a new type of topology called a "zig-zag" edge coupled filter. FIG. 6a is a diagram of an illustrative layout of a zig-zag filter 24 designed in accordance with the teachings of the present invention, and FIG. 6b is an equivalent circuit schematic of the illustrative zig-zag filter 24.

The zig-zag filter 24 is similar to a coupled-line filter topology but includes a 90 degree bend in each coupled section so that the layout has a more compact design having smaller foot print. FIG. 7 is a diagram of a layout of a conventional edge coupled filter 110. The conventional edge coupled filter 110 includes a series of coupled resonators (five resonators 112, 114, 116, 118, and 120 are shown in FIG. 7). Each resonator is an open-ended transmission line, with half of the resonator line coupled to the adjacent line on one side and the other half of the resonator line coupled to the adjacent line on the other side. For example, the first half of resonator 114 is coupled to the second half of resonator 112 and the second half of resonator 114 is coupled to the first half of resonator 116.

Returning to FIGS. 6a and 6b, the novel zig-zag filter 24 includes a series of resonators (eight resonators 90, 92, 94, 96, 98, 100, 102, 104 and 106 are shown in the illustrative embodiment of FIG. 7). As with a conventional edge coupled filter, each resonator is an open-ended transmission line, with half of the resonator line coupled to the adjacent line on one side and the other half of the resonator line coupled to the adjacent line on the other side. In accordance with the teachings of the present invention, instead of having conventional straight line resonators, each resonator of the zig-zag filter is bent at a particular angle. In the illustrative embodiment, each resonator includes a 90 degree bend at the center of the line, forming an "L" shaped resonator. This new filter layout offers a smaller footprint, with a reduction of nearly 30% compared to conventional edge coupled filters. The design procedure is more complex since now one has to take into account the parasitic effects of the 90 degree bend on the performance of the filter. Design adjustments can be made to the length, width, and spacing of the coupled line sections to optimize the filter response over the required frequency band.

FIG. 8a is graph showing the frequency response of the third filter 24 for the illustrative filter bank 10, and FIG. 8b is graph showing the frequency response of the fourth filter 26. As shown in FIGS. 8a and 8b, the third filter 24 is a bandpass filter covering 8–12 GHz and the fourth filter 26 is a bandpass filter covering 12–18 GHz. Of course, other types of filters and other design specifications may be used in the novel filter bank 10 without departing from the scope of the present teachings.

As discussed above, the switched filter bank 10 includes two switch chips 50 and 52. In an illustrative embodiment, the switch chips 50 and 52 are implemented using MEMS technology. For microwave applications, MEM switches offer lower insertion loss and lower power dissipation than conventional semiconductor based switches. Single pole single throw (SPST) MEM switches are known in the art. However, little work has been done to implement these switches into a single pole multiple throw architecture, and the few products that do exist are primarily single pole double throw (SPDT) switches.

Figure 9:
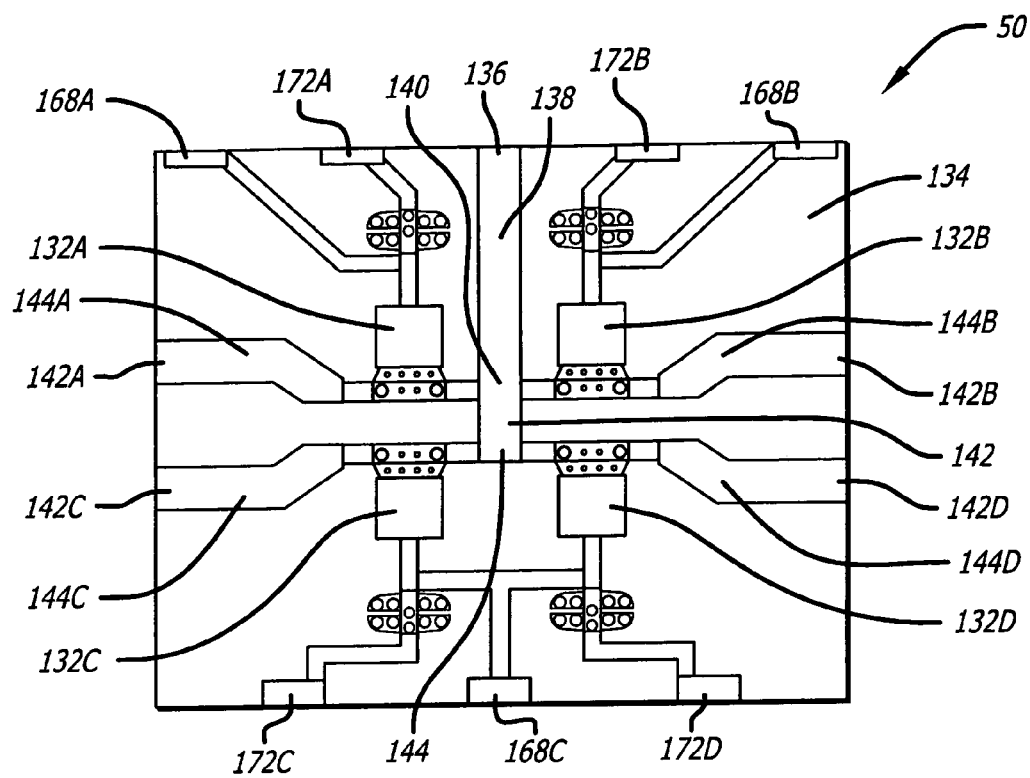
FIG. 9 is an illustration of an illustrative embodiment of a monolithic single pole four throw MEM switch designed in accordance with the teachings of the present invention.
Figure 10:
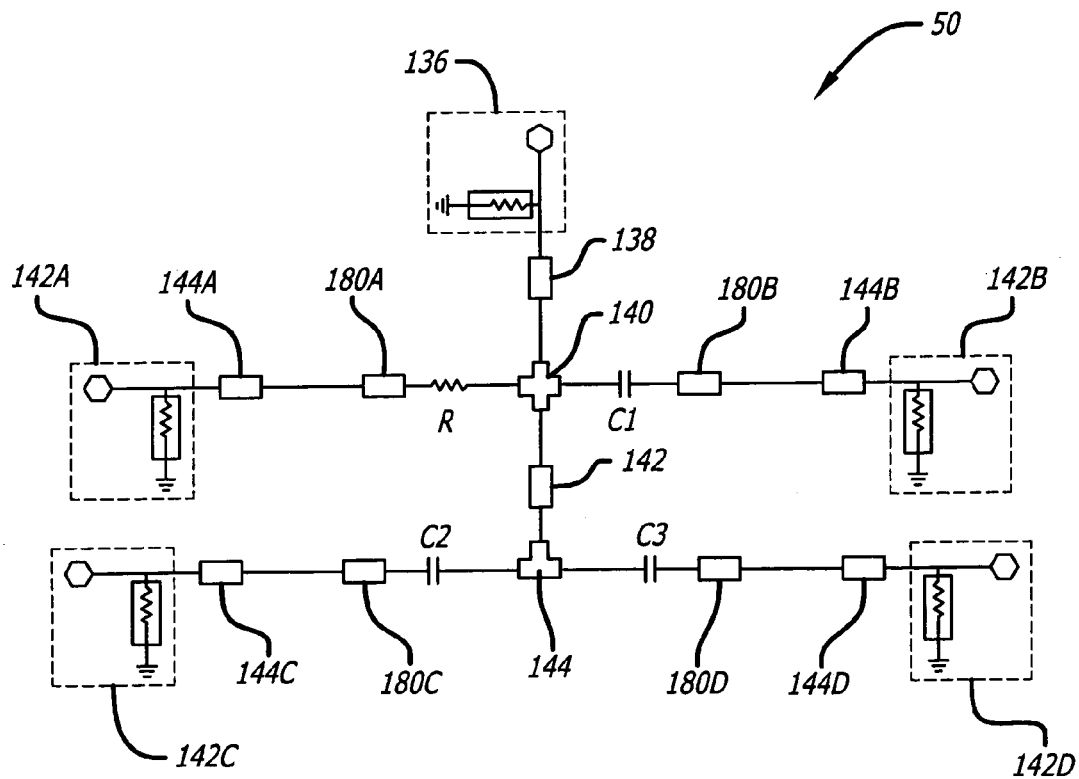
FIG. 10 is an equivalent circuit schematic of an illustrative SP4T MEM switch designed in accordance with the teachings of the present invention.
Figure 11:
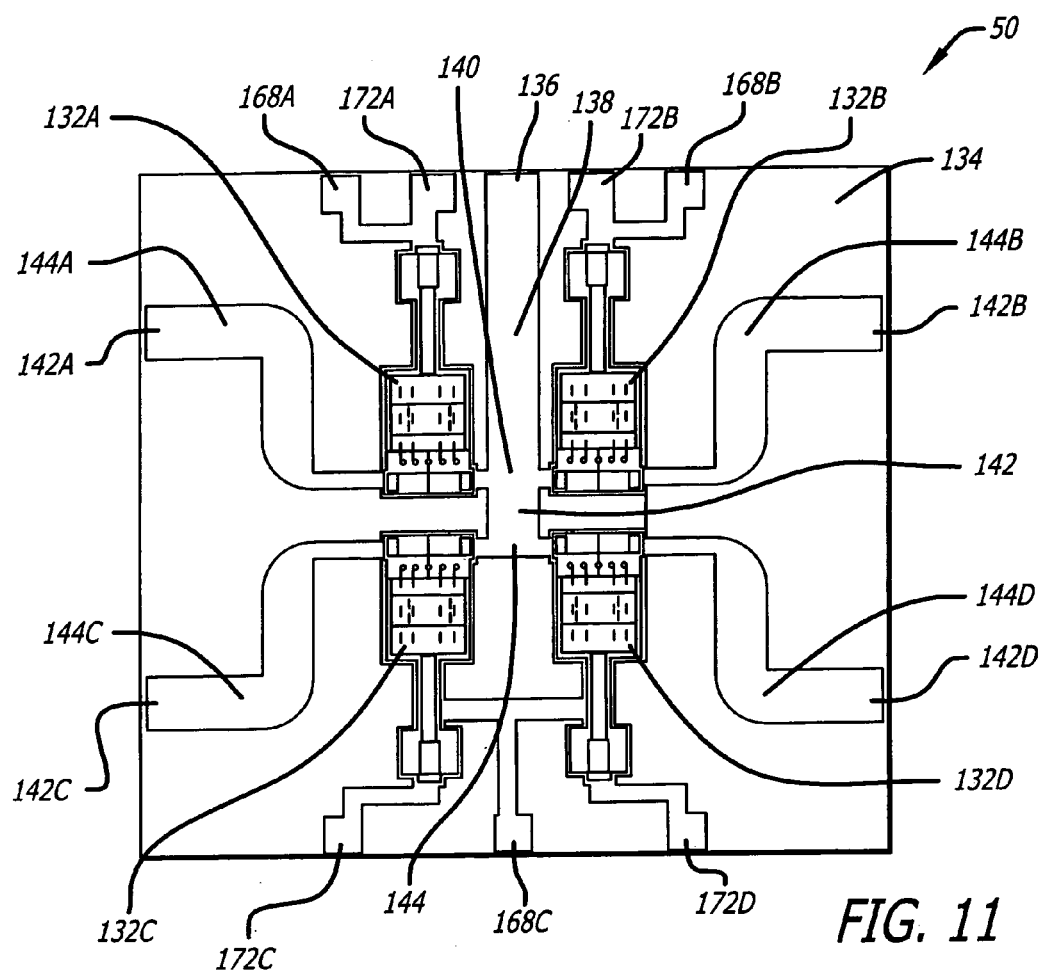
FIG. 11 is a layout diagram of an illustrative SP4T MEM switch designed in accordance with the teachings of the present invention.

FIG. 9 is an illustration of an illustrative embodiment of a monolithic single pole four throw MEM switch 50 designed in accordance with the teachings of the present invention. FIG. 10 is an equivalent circuit schematic of the illustrative SP4T MEM switch 50, and FIG. 11 is a layout diagram of the illustrative SP4T MEM switch 50.

The novel switch 50 is a monolithic circuit including four MEM switching units 132A, 132B, 132C, and 132D disposed on a single substrate 134 in a SP4T switch configuration. A transmission line 138 couples energy from an input port 136 to a first port of a four port junction 140. The second and third opposing ports of the four port junction 140 are coupled to the inputs of switching units 132A and 132B, respectively. The fourth port of the four port junction 140 (opposite the first port) is coupled to a first port of a three port junction 144 by a transmission line 142. The second and third opposing ports of the three port junction 144 are coupled to the inputs of switching units 132C and 132D, respectively.

The output of switching unit 132A is coupled to a first output port 142A by a transmission line 144A, the output of switching unit 132B is coupled to a second output port 142B by a transmission line 144B, the output of switching unit 132C is coupled to a third output port 142C by a transmission line 144C, and the output of switching unit 132D is coupled to a fourth output port 142D by a transmission line 144D.

Each switching unit 132 (132A, 132B, 132C, and 132D) is adapted to transmit energy from an input line to an output line when the switching unit is closed, and not transmit energy when the switching unit is open, as determined by a bias voltage applied to the switching unit. Each switching unit is positioned in series with its input-output transmission lines. Therefore, when the switch is open, there is no RF transmission (i.e. isolation state). By applying a bias voltage to the switching unit, the cantilever closes down creating an RF path for the microwave signal to pass through (transmission state).

Figure 12:
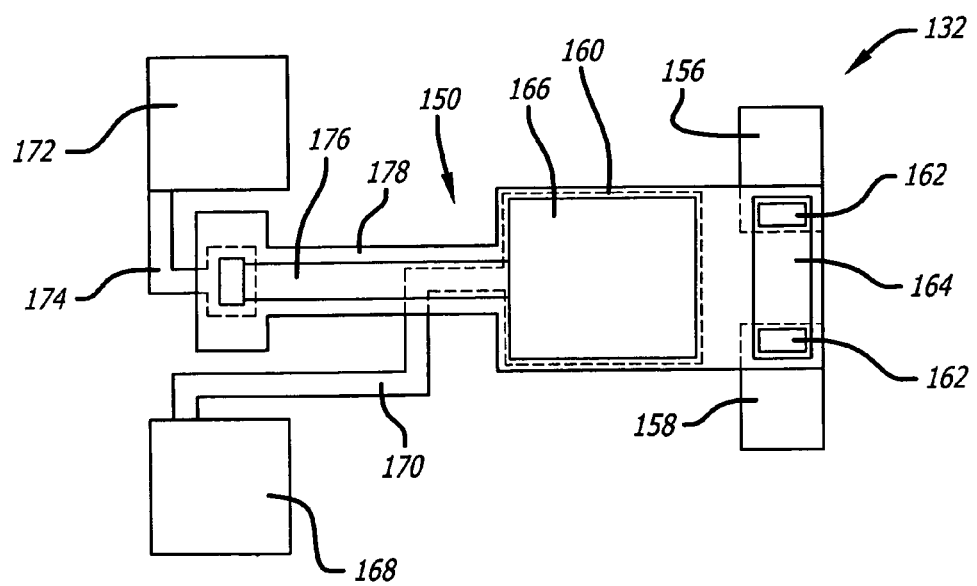
FIG. 12 is a diagram of an illustrative MEM switching unit that can be used in the SP4T MEM switch.
Figure 13A:
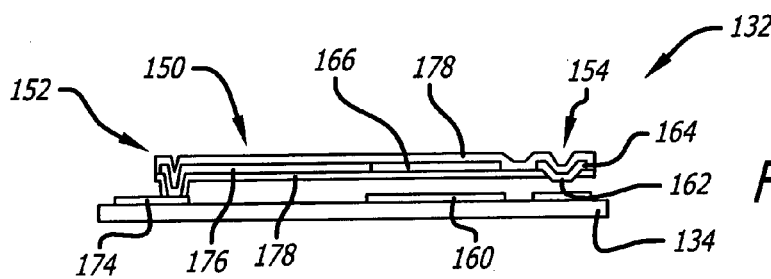
FIG. 13a is a diagram showing a side view of the illustrative switching unit during the open state.
Figure 13B:
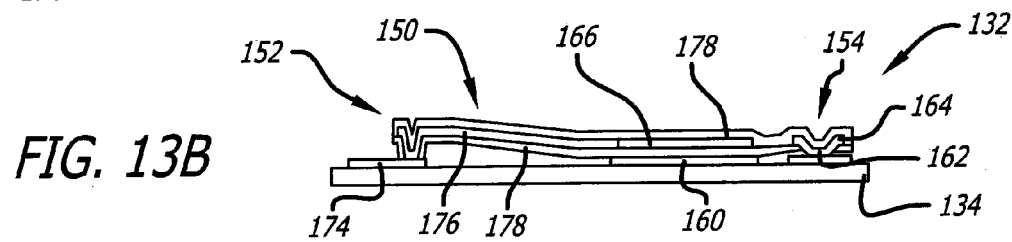
FIG. 13b is a diagram showing a side view of the illustrative switching unit during the closed state.

FIG. 12 is a diagram of an illustrative MEM switching unit 132 that can be used in the SP4T switch 50. Other types of MEM switching units may be used in the SP4T MEM switch 50 without departing from the scope of the present teachings. FIG. 13a is a diagram showing a side view of the illustrative switching unit 132 during the open state, and FIG. 13b is a diagram showing a side view of the illustrative switching unit 132 during the closed state. The switching unit 132 includes an armature 150 attached to the substrate 134 at a first end 152 of the armature 150. A second end or contact end 154 of the armature 150 is positioned over an input transmission line 156 and an output transmission line 158. A substrate bias electrode 160 is disposed on the substrate 134 under the armature 150. When the armature 150 is in the open position, the armature 150 is spaced from the substrate bias electrode 160 and the transmission lines 156 and 158 by an air gap.

A pair of conducting dimples, or contacts 162, protrude downward from the contact end 154 of the armature 150 such that in the closed position, one contact 162 contacts the input line 156 and the other contact 162 contacts the output line 158. The two contacts 162 are electrically connected by a conducting transmission line 164 so that when the armature 150 is in the closed position, the input line 156 and the output line 158 are electrically coupled to one another by a conduction path via the contacts 162 and conducting line 164. Signals can then pass from the input line 156 to the output line 158 (or vice versa) via the switching unit 132. When the armature 150 is in the open position, the input line 156 and the output line 158 are electrically isolated from one another.

The armature 150 also includes an armature bias electrode 166 disposed above the substrate bias electrode 160. The substrate bias electrode 160 is electrically coupled to a substrate bias pad 168 via a conductive line 170. The armature bias electrode 166 is electrically coupled to an armature bias pad 172 via a conductive line 174 and armature conductor 176. When a suitable voltage potential is applied between the substrate bias pad 168 and the armature bias pad 176, the armature bias electrode 166 is attracted to the substrate bias electrode 160 to actuate the switching unit 132 from the open position (FIG. 13a) to the closed position (FIG. 13b). The armature 150 can also include structural members 178 for supporting components such as the contacts 162, conducting line 164, bias electrode 166 and conductor 176.

Returning to the SP4T MEM switch 50 of FIGS. 9–11, the state of switching unit 132A is controlled by bias voltages applied to bias pads 168A and 172A, and the state of switching unit 132B is controlled by bias voltages applied to bias pads 168B and 172B. Switching units 132C and 132D are adapted to share a common bias pad. In the illustrative embodiment shown in FIGS. 9 and 11, switching units 132C and 132D are coupled to a common substrate bias pad 168C. The state of switching unit 132C is controlled by a bias voltage applied to an armature bias pad 172C, and the state of switching unit 132D is controlled by a bias voltage applied to an armature bias pad 172D.

In the illustrative embodiment, the switch 50 is adapted to couple energy from the input port 136 to one of the four output ports 142A, 142B, 142C, or 142D (or vice versa, from one of the output ports to the input port 136). Thus, only one switching unit will be closed, while the other switching units are open. The invention, however, is not limited to this configuration. The switch 50 may be adapted to couple energy to multiple output ports simultaneously without departing from the scope of the present teachings.

In the equivalent circuit schematic of FIG. 10, the MEM switching unit 32A is modeled when closed (low loss state) and is represented by a low resistance R of 0.5 Ohms. A transmission line 180A couples the MEM switch that is situated at input port junction 140 to the output transmission line 144A. The other three switching units are modeled in their isolation state (open state) and therefore are each represented by a low series capacitance of 5 fF. The switching unit 32B is modeled, when open, as a series capacitance C1 of 5 fF that decouples a transmission line 180B from the output port 142B. Similarly, switching unit 32C is modeled as a series capacitance C2 of 5 fF which decouples a transmission line 180C from the output port 142C, and switching unit 32D is modeled as a series capacitance C3 of 5 fF which decouples a transmission line 180D from the output port 142D.

Sample values for the circuit components shown in FIG. 10 are: transmission lines 138, 144A, 144B, 144C, and 144D each having a width of 70 □m and a length of 400 □m; transmission lines 180A, 180B, 180C, and 180D each having a width of 25 □m and a length of 85 □m; transmission line 142 having a width of 70 □m and a length of 100 □m; resistor R=0.5 Ω; and capacitors C1=C2=C3=5 fF.

The following table compares the performance of the new MEM SP4T switch with that of a conventional GaAs MMIC PIN SP4T switch. As shown, the main advantages of the MEM switch are its negligible power consumption and its ease of biasing. In one embodiment, the size of the MEM SP4T switch chip is 3.0 mm×2.5 mm×0.1 mm. The chip dimensions, of course, may vary without departing from the scope of the present teachings.

| Technology | Area | DC Control Voltages | DC Block/ Chocks | DC Control Power |
|---|---|---|---|---|
| MEM SP4T | 7.5 sq. mm | 1 | No | <1.0 nanowatt |
| MMIC PIN SP4T | 9.0 sq. mm | 2 | Yes | 300 mW |

Figure 14A:
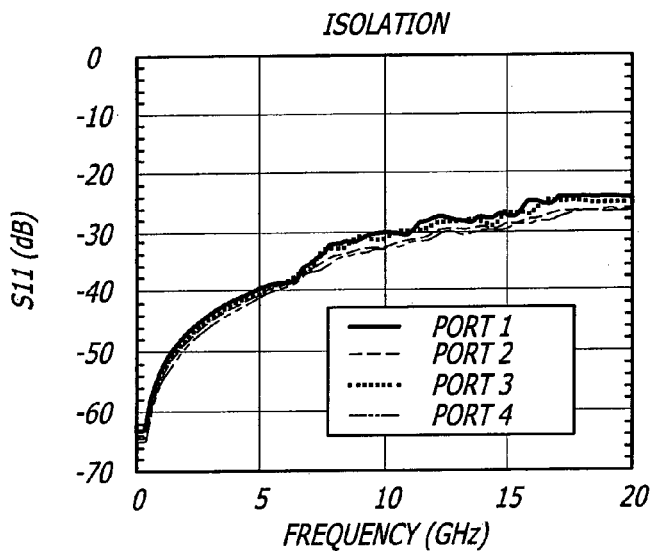
FIG. 14a is a graph of the measured isolation of the illustrative SP4T MEM switch.
Figure 14B:
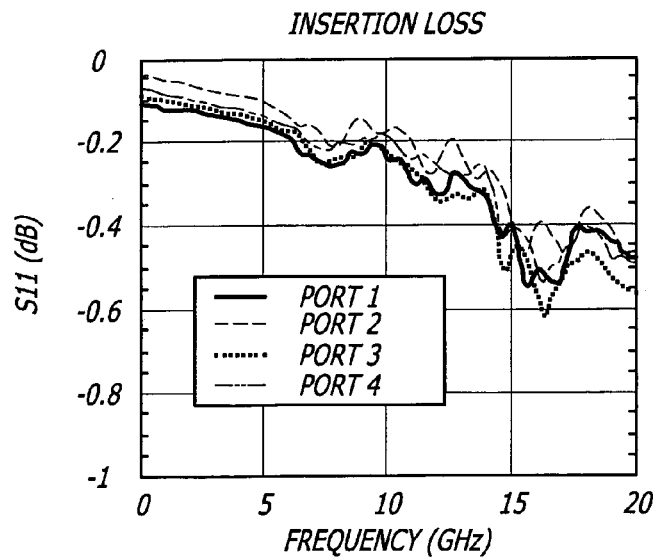
FIG. 14b is a graph of the measured insertion loss of the illustrative SP4T MEM switch.

FIG. 14a is a graph of the measured isolation of the illustrative SP4T switch 50, and FIG. 14b is a graph of the measured insertion loss of the illustrative SP4T switch 50. As shown, an isolation of greater than 25 dB can be achieved, while an insertion loss of less than 0.6 dB is obtained when the switch is closed, for the frequency range from 0 to 20 GHz. Also, excellent performance tracking is obtained between the switch paths.

A MEM SP4T switch 50 of this design is used in the illustrative switched filter bank 10 shown in FIG. 1, to couple energy from the input port 32 to one of the four filters 20, 22, 24, and 26. A second MEM SP4T switch 52 is also used to couple energy from one of the filters 20, 22, 24, and 26 to the output port 36. A dielectric layer may be embedded within the bottom substrate 12 to support the DC bias routing to the switch bias pads.

Thus, a small, low cost, high performance switched filter bank can be constructed by combining the monolithic single pole multiple throw MEM switch and the miniature microwave circuit design of the present invention. In an illustrative embodiment, the switched filter bank covers the 2–18 GHz frequency band in four discrete channels of 2–4 GHz, 4–8 GHz, 8–12 GHz and 12–18 GHz. The MEM SP4T shows an excellent tracking performance for each arm (less than 0.6 dB of insertion loss and greater than 25 dB of isolation from DC to 20 GHz). The overall insertion loss due to the combined switches and filter is less than 1.5 dB for each channel. The estimated unit production cost for the switched filter bank MCM is in the range of $50–$70. The MCM dimensions for the illustrative filter bank are 1.0"× 1.0"×0.05", with a weight of 60 g and DC power consumption of less than 1 nW. This is an overall MCM volume reduction of over 80 fold, and weight reduction of over 100 fold compared with the prior art Alumina based MCM implementation.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A microwave circuit comprising:
   a first substrate;
   a first ground plate disposed on a bottom surface of said first substrate;
   a second substrate attached to a top surface of said first substrate and adapted to cover a portion of said first substrate;
   a second ground plate disposed on a top surface of said second substrate;
   a pattern of metallization disposed between said first and second substrates to form a stripline circuit;
   one or more ground paths disposed on the top surface of said first substrate and including a plurality of vias connected to said first ground plate; and
   one or more openings cut into said second substrate and second ground plate, wherein each opening follows and is aligned over a portion of a ground path and is filled in with conducting material, such that said second ground plate is connected to said first ground plate.

2. The invention of claim 1 wherein said first substrate is fabricated from high dielectric constant ceramic.

3. The invention of claim 1 wherein said first substrate has a relative dielectric constant greater than or equal to 40.

4. The invention of claim 1 wherein said second substrate is fabricated from high dielectric constant ceramic.

5. The invention of claim 1 wherein said second substrate has a relative dielectric constant greater than or equal to 40.

6. The invention of claim 1 wherein one or more regions of said first substrate are not covered by said second substrate.

7. The invention of claim 6 wherein said microwave circuit further includes a pattern of metallization disposed on the top surface of said first substrate in one of said regions to form a microstrip circuit coupled to said stripline circuit.

8. A multi-chip module comprising:
   a first substrate of high dielectric constant ceramic;
   a first ground plate disposed on a bottom surface of said first substrate;
   a second substrate of high dielectric constant ceramic attached to a top surface of said first substrate and adapted to cover a portion of said first substrate, wherein the portion covered by said second substrate forms a stripline region and the portion or portions not covered by said second substrate form a microstrip region;
   a second ground plate disposed on a top surface of said second substrate;
   a pattern of metallization disposed between said first and second substrates to form a stripline circuit;
   one or more integrated circuit chips attached to said first substrate in said microstrip region; and
   one or more transmission lines disposed on the top surface of said first substrate and adapted to couple said integrated circuit chips with each other and/or with said stripline circuit.

9. The invention of claim 8 wherein said multi-chip module further includes one or more ground paths disposed on the top surface of said first substrate and including a plurality of vias connected to said first ground plate.

10. The invention of claim 9 wherein said multi-chip module further includes one or more openings cut into said second substrate and second ground plate, wherein each opening follows and is aligned over a portion of a ground path and is filled in with conducting material, such that said second ground plate is connected to said first ground plate.

11. The invention of claim 8 wherein said first substrate has a relative dielectric constant greater than or equal to 40.

12. The invention of claim 8 wherein said second substrate has a relative dielectric constant greater than or equal to 40.

* * * * *